United States Patent [19]
Kitabatake et al.

[11] Patent Number: 6,090,457
[45] Date of Patent: Jul. 18, 2000

[54] PROCESS OF MAKING A THIN FILM

[75] Inventors: Akihiro Kitabatake; Keiji Yamada, both of Osaka, Japan

[73] Assignee: Sanyo Vaccum Industries Co. Ltd., Osaka, Japan

[21] Appl. No.: 09/076,885

[22] Filed: May 13, 1998

[30] Foreign Application Priority Data

Oct. 21, 1997 [JP] Japan ..................... 9-288752

[51] Int. Cl.⁷ ............. C23C 14/34; C23C 16/00
[52] U.S. Cl. .............. 427/585; 204/192.11; 427/255.28; 427/593
[58] Field of Search .............. 427/255.28, 585, 427/593; 204/192.11

[56] References Cited

FOREIGN PATENT DOCUMENTS 55-94473  7/1980  Japan .

*Primary Examiner*—Leo B. Tentoni
*Attorney, Agent, or Firm*—Armstrong, Westerman, Hattori, McLeland & Naughton

[57] ABSTRACT

The film-forming apparatus includes a gas introduction tube for introducing an inert gas into a vacuum chamber, a vapour source and a target, and forms a thin film by depositing sputtered particles and evaporated particles on the surface of a substrate, the sputtered particles being liberated by sputtering the target using ion energy of plasma generated around the target while the evaporated particles being obtained by evaporating a vapour source by heating and ionising evaporated components using the plasma. This apparatus comprises a substrate holder for holding the substrate so that its film-forming surface faces the side wall of the vacuum chamber; a rotating table for rotating the substrate holder within the vacuum chamber; a target arranged in the side wall of the vacuum chamber so that its sputtering surface faces the inside of the vacuum chamber; a shield detachably fitted in a through hole formed approximately through the centre of the target and having a hollow space therein; a gas introduction tube for introducing the inert gas into the hollow space of the shield; and a vapour source provided in the hollow space near the gas exit of the gas introduction tube. This apparatus is employed in the film-forming method of the present invention.

3 Claims, 3 Drawing Sheets

PROCESS OF MAKING A THIN FILM

BACKGROUND OF THE INVENTION

The present invention relates to an apparatus for forming a thin film provided with a sputtering target and a vapour source, and a method for producing a thin film using the apparatus.

Formation of a relatively thick (about 1 μm), uniform film of multiple components should be carried out in a short period of time in order to obtain a film of high precision. For example, Japanese Patent Application Laid-open No. 94473/1980 (JP-A-55-94473) discloses an ion-plating apparatus provided with a sputtering target and a vapour source to form a multi-component film.

This apparatus, as shown in FIG. 3, comprises a substrate 46 fixed inside a vacuum chamber 41, a vapour source 45 disposed in the lower part of the vacuum chamber 41, a target 42 and a sputtering electrode 43 each placed between the substrate 46 and the vapour source 45, an anode 44 disposed on the side of the vapour source 45, and a hot cathode 47 provided on the side of the substrate 46 to generate gas-discharge plasma. In the vacuum chamber 41 of this apparatus, where gas is introduced from a gas supply source 48, a film is formed by evaporating the vapour source 45 at a constant rate through heating and then ionising the particles of the evaporated components in gas-discharge plasma, as well as applying a high-frequency magnetic field to the sputtering electrode 43 for sputtering the target 42. The film formed on the substrate 46 is composed of the evaporated component and the sputtered component.

This ion-plating apparatus, however, fails to produce a uniform film on a large substrate, which is in great demand recently. In the vacuum chamber 41, while the vapour source 45 faces the substrate 46, the target 42 is arranged approximately perpendicular to the substrate 46 in the vicinity thereof. This structure prevents particles sputtered out of the target 42 from uniformly reaching the surface of a large substrate to give a uniform layer.

Besides, the substrate 46 and the vapour source 45 are spaced at such a distance that the ionised evaporated particles cannot reach the substrate in a short time. This causes degradation of the precision of a film.

SUMMARY OF THE INVENTION

It is, therefore, an object of the present invention to solve the above problems, specifically by providing a method for forming a uniform and highly-precise film and an apparatus for the same.

The film-forming method of the present invention comprises the steps of introducing an inert gas into a vacuum chamber and depositing, on the surface of a substrate, sputtered particles liberated by sputtering a target using ion energy of plasma generated around the target and evaporated particles obtained by evaporating a vapour source by heating and ionising thus evaporated components using the above plasma, and the method is characterised in arranging the target in the side wall of the vacuum chamber so that its sputtering surface (the surface to be sputtered) faces the inside of the vacuum chamber; conducting sputtering of the target and heating of the vapour source simultaneously or separately, while introducing the inert gas through a hollow space of a shield which is detachably fitted in a through hole formed approximately through the centre of the target, with keeping the surface of the substrate opposite to the sputtering surface of the target; and carrying thus yielded sputtered particles and evaporated particles, simultaneously or separately, to the surface of the substrate with a jet of the inert gas, thereby to form a thin film.

Moreover, the film-forming method of the present invention may use different materials respectively for the target and the vapour source.

Further, the film-forming method of the present invention may comprise a plurality of the targets and the vapour sources and fit the shield detachably in each target so that the inert gas can be introduced into the hollow space of the shield.

According to the film-forming method of the above structure, it is possible to conduct the sputtering step of supplying a voltage to a target electrode and the vapour source heating step simultaneously or separately, while ejecting the inert gas through the hollow space of the shield which is fitted approximately in the centre of the target. Owing to a jet of the inert gas, the sputtered particles and the ionised evaporated particles can reach the substrate in a shorter time, thus uniformly forming a film on the whole surface of the substrate.

A multi-component film can be also formed by preparing the target and the vapour source of different materials.

Further, arrangement of plural targets and vapour sources is effective to form a uniform and highly precise film on a large substrate and plural substrates.

The film-forming apparatus of the present invention, comprising a gas introduction tube for introducing an inert gas into the vacuum chamber, a vapour source and a target, is employed in the above method for forming a thin film on the substrate by depositing sputtered particles liberated by sputtering the target using ion energy of plasma generated around the target and evaporated particles obtained by evaporating a vapour source by heating and ionising thus evaporated components using the plasma. The film-forming apparatus is characterised in comprising a holding part for holding the substrate so that its film-forming surface faces the side wall of the vacuum chamber, a rotating table for rotating the holding part within the vacuum chamber, a target arranged in the side wall of the vacuum chamber with its sputtering surface facing the inside of the vacuum chamber, a shield detachably fitted in a through hole formed approximately through the centre of the target and having a hollow space therein, a gas introduction tube for introducing the inert gas into the hollow space of the shield, and a vapour source provided in the hollow space near a gas exit of the inert gas introduction tube.

Moreover, the film-forming apparatus may comprise two vapour sources provided in the hollow space near the gas exit of the inert gas introduction tube and composed of the same element or more than one elements, and a change-over switch for selectively supplying power to heat either of the two vapour sources.

Further, the film-forming apparatus may comprise a plurality of integrated units, each of which comprises the shield having a hollow space equipped with the gas introduction tube and the vapour source as well as the target and arranged in or in the vicinity of the side wall of the vacuum chamber, and may allow the holding part to hold plural substrates.

The film-forming apparatus of the present invention is designed to carry out the aforesaid film-forming method. A uniform and highly precise thin film can be formed all over the surface of a substrate, because the sputtered particles and the ionised evaporated particles derived from the vapour source near the inert gas exit are both carried with a jet of the inert gas onto the substrate, and the film-formation process is conducted with rotating the substrate.

The two vapour sources function as follows: when both vapour sources are of the same element, one is reserved until the other is consumed, whereas vapour sources of different elements can provide a multi-component thin film. The vapour source may also be in boat plate-type or crucible-type. Additionally, the vapour source may be in the form of a wire or a powder and fed from the outside of the vacuum chamber for a continuous long-time operation. These vapour sources are switchable to each other, as required, by a change-over switch.

Further, the integrated unit of the vapour source-mounted shield and the target facilitates installment of plural shields and targets. Arrangement of the plural integrated units ensures uniform and highly precise formation of a thin film not only on a large substrate but also on a plurality of substrates at the same time.

DETAILED DESCRIPTION OF TEE PREFERRED EMBODIMENTS

Figure 1:
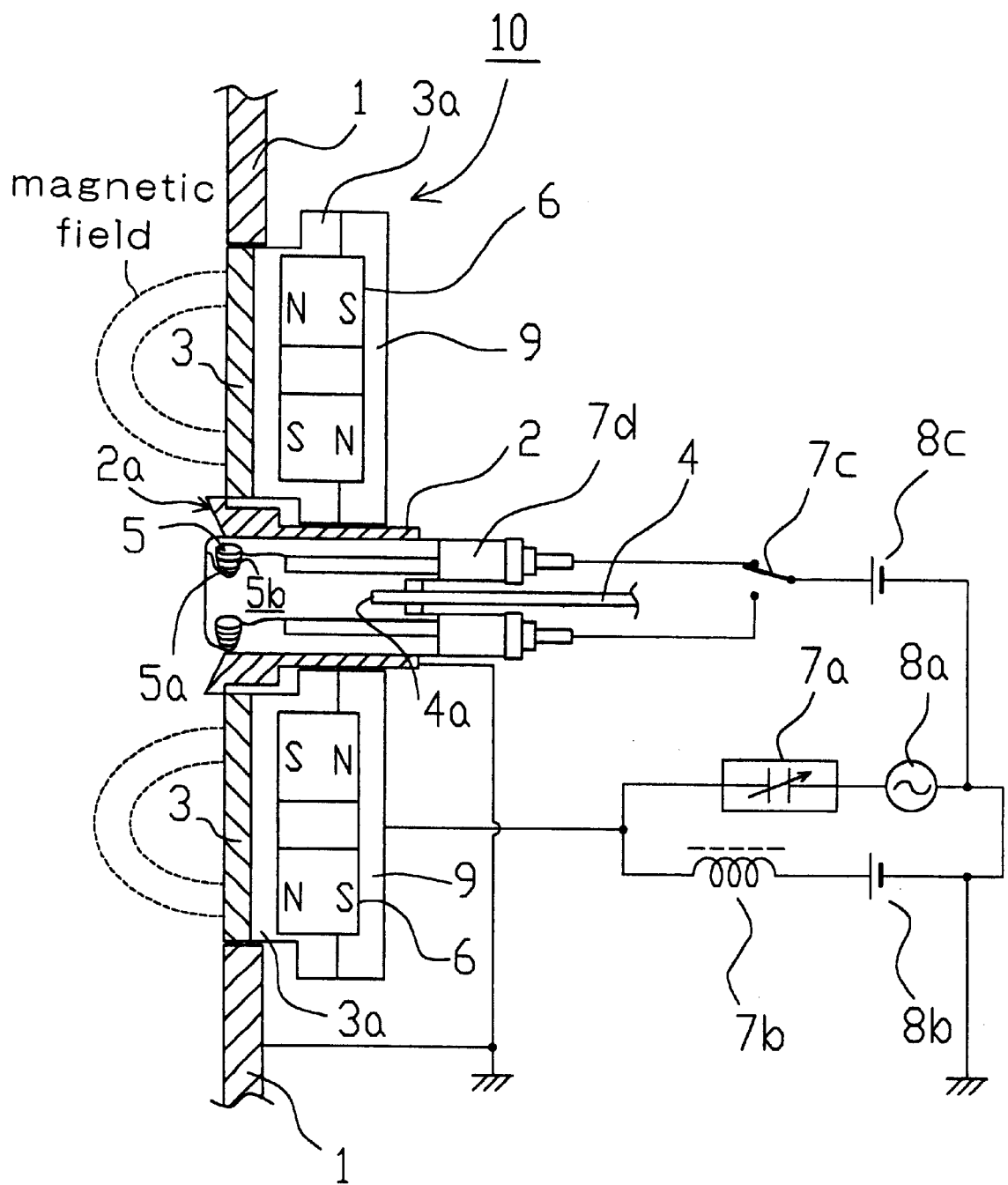
FIG. 1 illustrates a schematic view of the fundamental construction of the film-forming apparatus according to one embodiment of the present invention.
Figure 2:
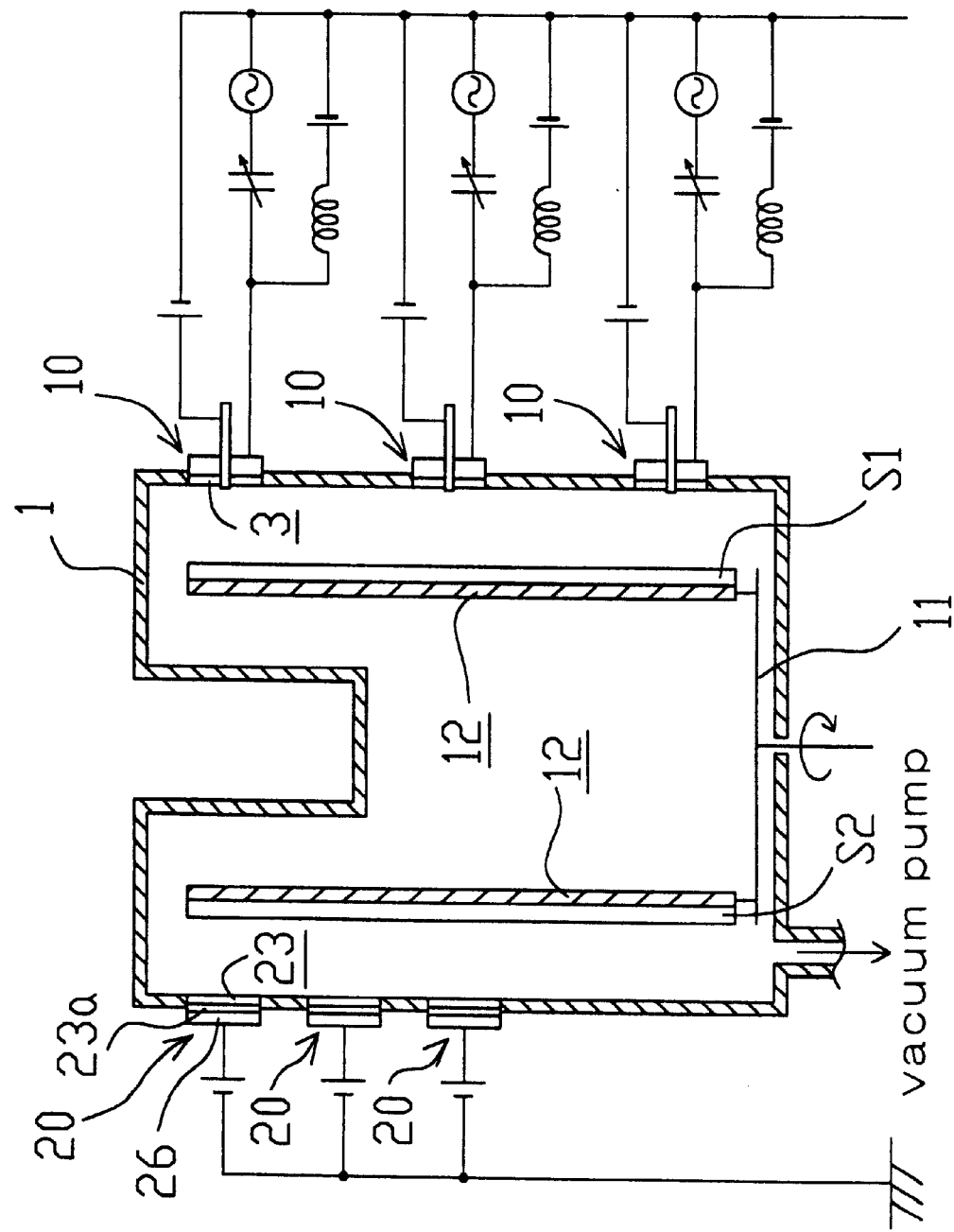
FIG. 2 illustrates a schematic view of an entire construction of the film-forming apparatus according to one embodiment of the present invention.
Figure 3:
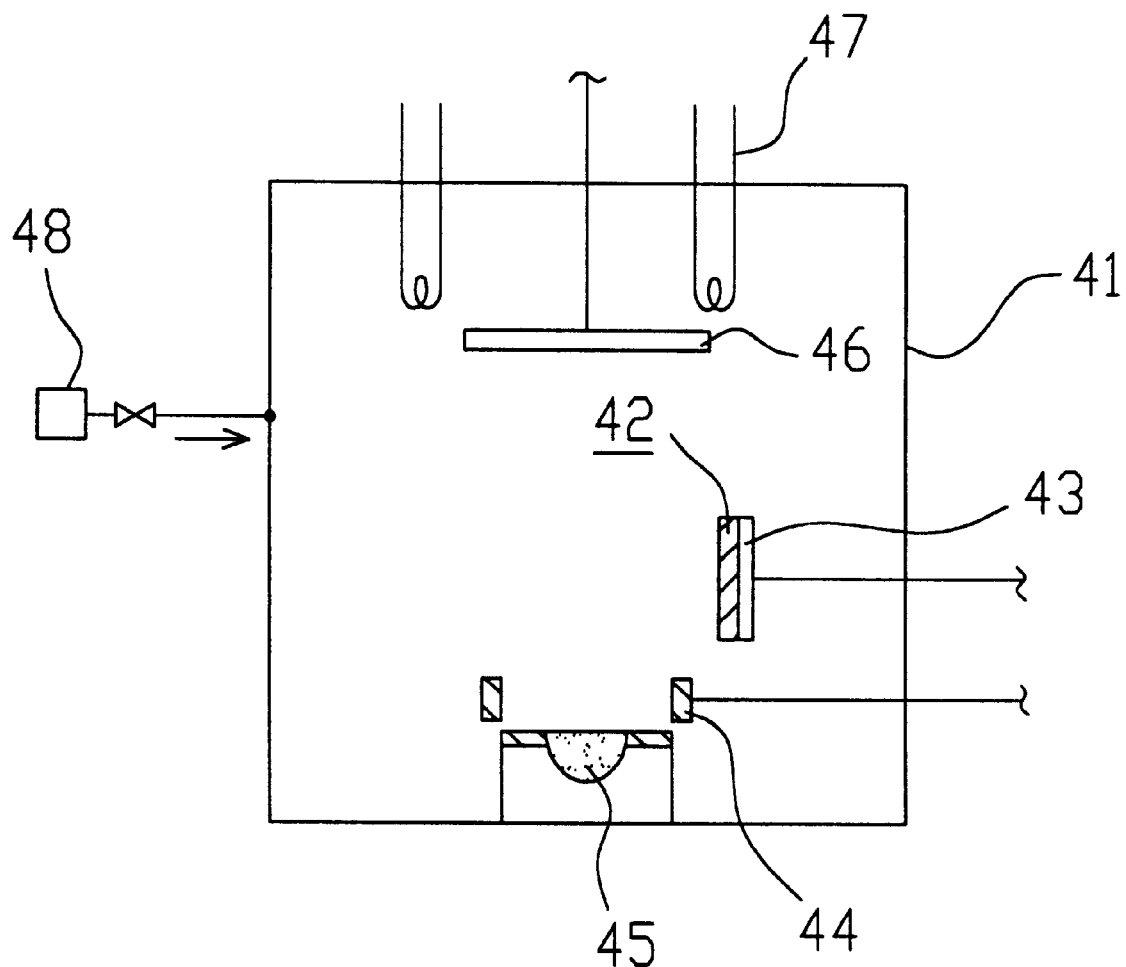
FIG. 3 shows a construction of a conventional film-forming apparatus.

Referring to the drawings, embodiments of the present invention are hereinafter described. FIG. 1 illustrates a schematic view of the fundamental construction of a film-forming apparatus of an embodiment of the present invention, and FIG. 2 is a schematic view of an entire construction of the film-forming apparatus.

A vacuum chamber 1 is connected to a vacuum pump (not shown) which creates a vacuum of a predetermined degree in the vacuum chamber 1. A plurality of first sputtering units 10 and second sputtering units 20 are vertically installed respectively on the side wall of the vacuum chamber 1. As shown in FIG. 1, the first sputtering unit 10 comprises a copper target 3 disposed so that its sputtering surface faces the inside of the vacuum chamber 1, a permanent magnet 6 provided outside the vacuum chamber 1 via the target 3 and a target electrode 3a, and a yoke 9 mounted in contact with the permanent magnet 6. A cylindrical shield 2 is fitted in a through hole formed approximately through the centre of the target 3, with one end thereof opening outwardly to form an inclined portion 2a. The shield 2 is equipped with a gas introduction tube 4 for introducing an inert gas into the vacuum chamber 1, and two vapour sources 5 filled in vapour source containers 5b placed near a gas exit 4a of the gas introduction tube 4. The vapour sources 5 are evaporated by heating the containers 5b with coils 5a wound around the side walls thereof. Power is selectively supplied to either of the coils 5a by a switch 7c. In the embodiment, copper is used as the vapour source. The voltage supplied to the target electrode 3a is prepared by superimposing a voltage transmitted from an alternating-current RF power source 8a through an impedance matching box 7a and a voltage transmitted from a direct voltage source 8b for sputtering connected in series with a low-pass filter circuit 7b.

The second sputtering unit 20 comprises a chromium target 23, and a permanent magnet 26 disposed outside the vacuum chamber 1 via a target electrode 23a. Direct current is supplied to the target electrode 23a.

In the vacuum chamber 1, substrates $S_1$, $S_2$ are held by substrate holders 12, with keeping their film-forming surfaces face-to-face with the targets 3, 23, respectively. The substrate holders 12 are mounted on a rotating table 11 which is driven by a motor (not shown) and rotates in the vacuum chamber 1.

Now, using the above film-forming apparatus, a thin film (Cr—Cu—Cr layer film) is formed on the surfaces of the substrates $S_1$, $S_2$, according to the manner hereinafter disclosed.

The substrates $S_1$, $S_2$, as the base for forming thin films, are brought into the vacuum chamber 1 from a door (not shown) which is evacuated in advance to a predetermined degree of vacuum, and mounted on the substrate holders 12. Then, the substrate S (hereinafter, S indicates both $S_1$ and $S_2$) is shifted to a position opposite to the target 23 by rotating the rotating table 11 by a motor. At this position, a voltage is supplied to the target electrode 23a for the sputtering of the target 23, whereby Cr particles are deposited on the substrate S to form a Cr layer.

Next, the Cr-layered substrate S is brought opposite to the target 3. At this position, while inert Ar gas is introduced into the vacuum chamber 1, sputtering of the target 3 is conducted, on the one hand, by supplying a superimposed voltage composed of a voltage from the RF power source 8a connected through the matching box 7a to the target electrode 3a and a voltage from the direct voltage source 8b connected in series with the low-pass filter circuit 7b. Through this process, Cu particles are liberated and deposited on the substrate S. On the other hand, simultaneously, the vapour source 5 is heated by a voltage supplied from a power source 8c through a terminal 7d to the coil 5a. Then, the Cu particles evaporated out of the vapour source 5 are thrown towards the substrate S with a jet of an inert gas ejected nearby, and deposited thereon. The Cu particles derived from these steps provide a Cu layer, thus giving a thin two-layer Cr—Cu film on the substrate S.

Thereafter, the substrate S is again moved opposite to the target 23. Cr particles are likewise deposited to give a three-layer film of Cr—Cu—Cr.

The present embodiment employs a large-sized substrate as the substrate S. Nevertheless, a thin film obtained herein is uniform and very precise. In comparison with the conventional technology, the sputtered particles and the evaporated particles can cover a larger area as a result of the vertical arrangement of the plural sputtering units 10, 20 on the side wall of the vacuum chamber 1. In addition, introduction of an inert gas helps these particles reach the substrate S in a short time and thus ensures the precision of the film.

In the present embodiment, both of the two vapour sources are made of the same element (Cu). When one vapour source is consumed, a change-over switch 7c switches the power supply to the other vapour source, so that Cu particles are evaporated continuously.

The present embodiment is directed to the formation of a Cr—Cu—Cr film. However, thin films of other compositions are also obtainable in accordance with the combinations of the target 23, the target 3, and the vapour source 5.

By way of example, the combination of a titanium target 23, a tungsten target 3 and an aluminium vapour asource 5 provides a Ti—Al(W)—Ti film.

The present invention should not be limited to the combined use of the first sputtering unit 10 and the second sputtering unit 20, as described in the above embodiment. Independent use of the first sputtering unit 10 can also provide a multi-component thin film. For example, a TiN film is formed by using a first sputtering unit 10 composed of a titanium target 3 and a titanium vapour source 5 and ejecting a reactive gas of nitrogen or ammonium. In addition, a Cr—Cu—Cr film is obtainable with the independent use of first sputtering unit 10 by constituting one vapour source 5 with chromium and the other with copper and appropriately operating the change-over switch 7c.

When the target 3 and the vapour source 5 are made of different materials, the structure of a multi-component thin film is controlled by conducting the sputtering of the target and the ejection of the evaporated particles at separate timings.

As exemplified above, various film-forming conditions can be achieved not only by proper combination of the target material, vapour source material and inert gas, but also by proper control of the timing and duration of releasing respective particles.

Incidentally, the positions and directions of the first sputtering units 10 and the second sputtering units 20 are not limited to the definition of the present embodiment. These factors may be arranged to suit the size and number of the substrate.

Further, the vapour source 5 may be a boat plate-type or crucible-type vapour source. Alternatively, an evaporation material can be fed from the outside of the vacuum chamber either in the form of a wire through a wire-feeding device or in the form of a powder through a pipe. This structure enables continuous feeding of the evaporation material for a long time.

What is claimed is:

1. A method for forming a thin film which comprises introducing an inert gas into a vacuum chamber and depositing sputtered particles and evaporated particles on the surface of a substrate, the sputtered particles being liberated by sputtering a target using ion energy of plasma generated around the target while the evaporated particles being obtained by evaporating a vapour source by heating and ionising evaporated components using the plasma, which is characterised in:

arranging the target in the side wall of the vacuum chamber so that a sputtering surface thereof faces the inside of the vacuum chamber;

conducting sputtering of the target and heating of the vapour source simultaneously or separately, while introducing the inert gas through a hollow space of a shield which is detachably fitted in a through hole formed approximately through the centre of the target, with keeping the surface of the substrate opposite to the sputtering surface of the target; and carrying resulting sputtered particles and evaporated particles simultaneously or separately onto the surface of the substrate with a jet of the introduced inert gas, thereby to form a thin film.

2. A method for forming a thin film according to claim 1, wherein the material of the target is different from that of the vapour source.

3. A method for forming a thin film according to claim 1 or 2, which is characterised in arranging a plurality of the targets and vapour sources and detachably fitting a shield in each of the targets so that the inert gas is introduced into the hollow space of the shield.

* * * * *